United States Patent
Mattmann

(10) Patent No.: US 9,414,483 B2
(45) Date of Patent: Aug. 9, 2016

(54) METHOD OF MANUFACTURING AN ELECTRONIC HIGH-CURRENT CIRCUIT BY MEANS OF GAS INJECTION TECHNOLOGY AND SEALING WITH AN INSULATING POLYMER

(71) Applicant: Continental Automotive GmbH, Hannover (DE)

(72) Inventor: Erich Mattmann, Heidesheim (DE)

(73) Assignee: Continental Automotive GmbH, Hannover (DE)

( * ) Notice: Subject to any disclaimer, the term of this patent is extended or adjusted under 35 U.S.C. 154(b) by 64 days.

(21) Appl. No.: 14/045,329

(22) Filed: Oct. 3, 2013

(65) Prior Publication Data
US 2014/0138124 A1    May 22, 2014

(30) Foreign Application Priority Data

Oct. 5, 2012   (DE) .................. 10 2012 218 258
Dec. 20, 2012  (DE) .................. 10 2012 223 904

(51) Int. Cl.
| | |
|---|---|
| H05K 1/09 | (2006.01) |
| H05K 1/02 | (2006.01) |
| H05K 3/44 | (2006.01) |
| H05K 1/05 | (2006.01) |
| H05K 3/10 | (2006.01) |
| H05K 3/34 | (2006.01) |

(52) U.S. Cl.
CPC .............. *H05K 1/0265* (2013.01); *H05K 1/053* (2013.01); *H05K 3/44* (2013.01); *H05K 3/102* (2013.01); *H05K 3/3452* (2013.01); *H05K 2201/10969* (2013.01); *H05K 2203/1344* (2013.01); *Y10T 29/49124* (2015.01)

(58) Field of Classification Search
CPC ......... H01L 21/02; H01L 21/20; H01L 21/44; H01L 21/50; H01L 21/58; H01L 21/60; H01L 21/84; H01L 21/283; H01L 23/48; H01L 23/485
USPC ........... 174/251; 361/311, 313; 257/E21.008, 257/E21.277, E21.477, E21.499, E21.508, 257/E21.512, E21.703, E23.021, 779, 737, 257/782

See application file for complete search history.

(56) References Cited

U.S. PATENT DOCUMENTS

| | | | | |
|---|---|---|---|---|
| 5,668,410 A | * | 9/1997 | Yamamoto | 257/737 |
| 6,105,245 A | * | 8/2000 | Furukawa | 29/843 |
| 6,144,690 A | * | 11/2000 | Kusamichi | C22B 9/003 373/142 |
| 6,144,871 A | * | 11/2000 | Saito et al. | 600/395 |
| 6,218,281 B1 | * | 4/2001 | Watanabe et al. | 438/612 |
| 6,232,147 B1 | * | 5/2001 | Matsuki et al. | 438/108 |
| 6,285,085 B1 | * | 9/2001 | Taguchi | 257/780 |
| 2002/0113521 A1 | * | 8/2002 | Rapp | G01N 29/022 310/313 R |
| 2004/0113283 A1 | * | 6/2004 | Farnworth et al. | 257/782 |

(Continued)

FOREIGN PATENT DOCUMENTS

| | | |
|---|---|---|
| DE | 36 39 604 A1 | 5/1988 |
| EP | 0 823 832 A1 | 2/1998 |
| GB | 2 240 663 A | 8/1991 |

*Primary Examiner* — Xiaoliang Chen
(74) *Attorney, Agent, or Firm* — RatnerPrestia

(57) ABSTRACT

An electric circuit, for conducting high current and a process for manufacturing same. The circuit has a carrier body, which has a carrier surface, an insulation layer covering the carrier surface, a strip conductor for conducting current arranged on the insulation layer, and an outer insulation layer. The protective layer has at least one recess to provide an electric contact area to the strip conductor.

4 Claims, 2 Drawing Sheets

(56) References Cited

U.S. PATENT DOCUMENTS

| | | | |
|---|---|---|---|
| 2004/0137723 A1* | 7/2004 | Noma | H01L 21/6835 438/667 |
| 2005/0242714 A1* | 11/2005 | Chung et al. | 313/504 |
| 2006/0138671 A1* | 6/2006 | Watanabe | 257/773 |
| 2006/0214296 A1* | 9/2006 | Okamoto et al. | 257/751 |
| 2006/0267202 A1* | 11/2006 | Matsuzaki | 257/758 |
| 2006/0289991 A1* | 12/2006 | Morita et al. | 257/737 |
| 2007/0026639 A1* | 2/2007 | Noma | H01L 21/6835 438/459 |
| 2007/0111391 A1* | 5/2007 | Aoki et al. | 438/118 |
| 2007/0141800 A1* | 6/2007 | Kurihara | H01G 4/33 438/396 |
| 2007/0164432 A1* | 7/2007 | Wakisaka et al. | 257/737 |
| 2007/0190354 A1* | 8/2007 | Taylor | C23C 4/02 428/678 |
| 2007/0228561 A1* | 10/2007 | Matsuki et al. | 257/737 |
| 2007/0253144 A1* | 11/2007 | Kuwajima | 361/311 |
| 2008/0057632 A1* | 3/2008 | Arai et al. | 438/149 |
| 2008/0128904 A1* | 6/2008 | Sakamoto | 257/737 |
| 2008/0180880 A1* | 7/2008 | Okusawa | 361/313 |
| 2009/0014891 A1* | 1/2009 | Chang et al. | 257/777 |
| 2009/0121350 A1* | 5/2009 | Yamamoto et al. | 257/737 |
| 2009/0191665 A1* | 7/2009 | Nikitin | H01L 21/568 438/107 |
| 2009/0278443 A1* | 11/2009 | Terada et al. | 313/504 |
| 2010/0136248 A1* | 6/2010 | Hastings | C04B 41/009 427/450 |
| 2011/0100695 A1 | 5/2011 | Lin | |
| 2011/0169139 A1* | 7/2011 | Lin | H01L 23/481 257/621 |
| 2011/0169159 A1* | 7/2011 | Lin | H01L 21/481 257/692 |
| 2011/0186988 A1* | 8/2011 | Chen et al. | 257/737 |
| 2011/0248406 A1* | 10/2011 | Wada et al. | 257/773 |
| 2012/0119328 A1* | 5/2012 | Nakaiso | 257/532 |
| 2013/0224389 A1* | 8/2013 | Nakayama | B05B 7/0483 427/427.4 |
| 2014/0042870 A1* | 2/2014 | Ohashi | H03H 3/08 310/313 R |

\* cited by examiner

METHOD OF MANUFACTURING AN ELECTRONIC HIGH-CURRENT CIRCUIT BY MEANS OF GAS INJECTION TECHNOLOGY AND SEALING WITH AN INSULATING POLYMER

CROSS-REFERENCE TO RELATED APPLICATIONS

This application claims priority to German Patent Application Nos. 10 2012 218 258.6 filed Oct. 5, 2012, and 10 2012 223 904.9, filed Dec. 20, 2012, the contents of such applications being incorporated by reference herein.

FIELD OF THE INVENTION

The present invention pertains to an electric circuit, in particular for conducting high current, as well as to a process for manufacturing an electric circuit.

BACKGROUND OF THE INVENTION

Electric circuits having a plurality of functional layers, which are sprayed onto a circuit carrier, are known. In circuit carriers which consist of an electrically conductive material, the circuits must be insulated from the circuit carrier in order to avoid an electric short-circuit. It is known, to this end, to apply an insulation layer between the conductive layer and the circuit carrier. It is necessary here to protect the insulation layer against moisture, since the supply of moisture impairs the insulating ability of the insulation layer.

It is state of the art to protect sprayed layers by means of a coating against moisture, whereby at first the electronics are assembled and then the overall structure is heated (>100° C.) and sealed by means of a coating. Prescribed tests of electronics, for example, measurement of the insulation resistance or of the breakdown voltage cannot be carried out on the sprayed layers. Therefore, a testing of the circuit is possible only after sealing the circuit after it has already been processed with components and plug-in components. The drawback here is that incorrectly produced circuits cannot be selected beforehand and represent a total loss as scrap parts. This increases the costs markedly, especially in a production of such circuits in high quantities.

SUMMARY OF THE INVENTION

An aspect of the present invention provides an electric circuit as well as a process for manufacturing a circuit, as a result of which a reliable protection of the insulation layer against moisture can be achieved. Further, an aspect of the present invention is to overcome the above-mentioned drawbacks.

This is accomplished according to a first aspect of the present invention by means of an electric circuit of the type mentioned in the introduction with a protective layer, which has at least one recess to provide an electric contact area to the strip conductor.

The circuit according to the present invention can hereby be tested for different electric properties already in the unfinished state. Erroneous circuits can thus be identified and sorted out already in an early stage of production. Loss of material and production time can thus be reduced considerably.

The protective layer is located, as outer layer, on the carrier surface and covers the insulation layer insofar as to prevent penetration of moisture into the insulation layer. At the same time, an electric contact area to the strip conductor is retained via the recess to place devices thereon for testing and to be able to conduct different electrical tests.

The protective layer has a material recess at the sites of the recess, such that the strip conductor is exposed in the area of the recess. As an alternative, however, other embodiments of the recess are also conceivable, provided that an electric contact to the strip conductor can be established thereby. For example, the use of other materials in the area of the recess or a different layer thickness in the area of the recess are conceivable. Furthermore, the recess is not limited to a certain shape.

Advantageously, an aspect of the present invention is varied by means of an embodiment of the circuit according to the present invention, in which the recess is arranged within a partial area of the strip conductor. According to this variant, the recess is limited to a size that is necessary for providing the electric contact. In this way, the strip conductor outside the recess is also protected by the protective layer against external effects, especially moisture, to prevent, e.g., a corrosion of the strip conductor. The position of the partial area on the strip conductor advantageously corresponds with the position, at which an electric component is arranged in the finished state of the circuit. The present invention thus also comprises an electric circuit, in which the protective layer has a plurality of recesses, and especially corresponding with the number and position of the electric components to be mounted onto the strip conductor. Accordingly, the electric properties of the strip conductor can be tested precisely at the sites, where an electric contact is established between the strip conductor and the electric component.

Especially advantageous is an embodiment of the circuit according to the present invention with a recess, which is arranged and designed in such a way that the protective layer covers an edge area of the strip conductor. Advantageously, the recess is arranged and designed or dimensioned in such a way that the protective layer covers at least one edge or edge area of the strip conductor. In this way the protective layer exerts a force, at the edge areas, which presses the strip conductor towards the insulation layer or carrier surface and mechanically stabilizes the arrangement of the layers.

Preferred is an embodiment of the circuit according to the present invention with a protective layer, which contains a material selected from the group of polymers. Especially advantageous here is an embodiment of the circuit according to the present invention, in which the protective layer contains a material selected from the group of silicones. The materials are simple to process and offer a very high, up to a hermetic, sealing of the insulation layer against moisture. In the unprocessed state, the materials are present in flowable form. They have a flowability or viscosity, such that they run well on the circuit after application and completely and uniformly cover the desired sites. In combination with a direct printing process or a screen printing process, these materials can be used particularly advantageously. The viscosity of such materials is typically between 25 Pascal and 65 Pascal. They become solidified below temperatures of >200° C. and thus form an inert chemical film.

Furthermore, an embodiment of the circuit according to the present invention is preferred, in which the material of the protective layer has a modulus of elasticity which corresponds approximately to the modulus of elasticity of the material of the strip conductor. The modulus of elasticity of the protective layer is preferably in the range of 85% to 115% of the modulus of elasticity of the strip conductor. Also preferred is an embodiment of the circuit according to the present invention, in which the material of the protective layer has a temperature resistance up to 200° C. Especially when the circuit is used under high current (>180 Ampere), it is thereby guaranteed that the heating and expansion of the strip conductor due to the current load does not lead to damage to the protective layer. Temperature resistance is defined here as the material extensively retaining its physical and chemical properties even under heat load.

Moreover, the circuit according to an aspect of the present invention is advantageously varied by a bonding layer being arranged between the protective layer and the strip conductor. The bonding layer can be used for making possible and/or improving both a mechanical and electrical contact between an electric component and the strip conductor. In this way, the material for the strip conductor can be flexibly selected to be bondable with other materials regardless of ability.

A further advantageous embodiment of the circuit according to an aspect of the present invention consists of the recess being arranged and dimensioned in such a way that the protective layer and the bonding layer form an overlapping area along the edges of the bonding layer and the mechanical stability of layers lying on top of one another is hereby increased.

The circuit according to an aspect of the present invention is advantageously varied in that the protective layer has a layer height in the area of the edges of the recess to enclose a flowable compound within the recess. In this way, the recess can be filled out by means of an additional material. The layer height of the protective layer is designed here, such that the edges of the recess protrude from the substrate, e.g., the strip conductor surface essentially in a dam-like manner and define the flowable compound laterally, so that it does not run outside of the recess. Bonding material needed for bonding electric components can thus be inserted into the recess. It is conceivable here to melt on the material of the bonding layer, fill it into the recess and then let it harden.

According to a further advantageous embodiment of the circuit according to an aspect of the present invention, the bonding layer consists of an electrically conductive material that can be bonded to a solderable material. Such a bonding layer makes it possible to bond electric components to the strip conductor by means of widely used soldering methods and is particularly advantageous with regard to high quantities.

Also advantageous is an embodiment of the circuit according to an aspect of the present invention, in which the shape and size of the recess essentially correspond with the shape and size of the bonding elements of a component to be bonded to the strip conductor. The recess is hereby limited to a necessary size, which is designed in such a way as to achieve a greatest possible protection of the circuit by means of the protective layer and at the same time to provide a sufficient contact area for the bonding elements of the electric component. The use of bonding materials, e.g., solder, can consequently be reduced to a necessary minimum which is sufficient to establish a stable bond of the component. As an alternative, the recess has a shape according to a basic geometric shape. Rectangular or circular recesses, which correspond to the current shape of electric components, are preferred here.

Advantageously, the embodiment of the circuit according to an aspect of the present invention is varied in that lateral edge surfaces of the insulation layer are covered by means of the protective layer. Thus, the insulation layer is completely enclosed, on the one hand, by the protective layer on its outer surface and on the lateral edge surfaces, and on the other hand, on the inner surface by the carrier surface of the carrier body. The insulation layer is hereby especially well protected against the penetration of moisture.

This is accomplished according to a second aspect of the present invention according to a process of the type mentioned in the introduction, wherein the process has the step: Applying the protective layer for covering the insulation layer. The process makes it possible to manufacture an electric circuit, such that the basic electric functions of the circuit already function and can be tested for possible defects in electronics. For this the insulation layer is covered by means of the protective layer to the extent that it is protected against moisture and achieves its full insulating ability. At the same time, the strip conductor remains uncovered, so that an electric contact to the strip conductor is retained.

Based on this, the process according to an aspect of the present invention is advantageously varied by applying the protective layer for covering the insulation layer and the strip conductor, whereby the protective layer has at least one recess, which is arranged within a partial area of the strip conductor. By means of this process, a protective layer is advantageously applied in one step to the insulation layer and to the strip conductor, whereby an electric contact area is still retained via the recess. An application of a protective layer to the strip conductor in a separate process step is thus eliminated.

The process according to an aspect of the present invention is preferably varied by the protective layer containing a material selected from the group of polymers. The process is especially varied by the protective layer containing a material selected from the group of silicones. These materials are particularly suitable for applying the protective layer precisely at the desired sites and to achieve a stable and defect-free application of the protective layer.

Advantageous here is a variant of the process according to an aspect of the present invention, in which the recess is produced by means of using a grid-like form pattern. The protective layer material, which is in a flowable form originally, can thus be applied especially uniformly and precisely to the circuit.

A variant of the process according to an aspect of the present invention, according to which the form pattern has at least two different mesh sizes, is especially advantageous here. The quantity of circuit protective material that is applied to the circuit can be controlled by means of the mesh size. Smaller meshes make possible a greater passage of material through the form pattern than larger meshes. A closed surface on the form pattern makes it possible to produce a recess of the protective layer. Different meshes make it possible to control the quantity of protective layer material to be applied locally depending on need. This quantity can especially be determined independently of the viscosity of the protective layer material.

Moreover, a variant of the process according to an aspect of the present invention in which the protective layer is applied by means of a screen printing process is preferred. Applying the protective layer using an aforementioned form pattern as well as an application pressure is particularly readily suitable for applying a closed protective layer with a uniform thickness to the circuit.

According to a further advantageous variant of the process according to an aspect of the present invention, the process also includes step b.2) applying a bonding layer in a partial area of the strip conductor following step b.1).

Especially preferably, the process according to an aspect of the present invention is advantageously varied by applying the protective layer for covering the insulation layer, strip conductor and bonding layer, whereby the protective layer has at least one recess, such that the protective layer and the bonding layer form an overlapping area along the edges of the bonding layer.

Moreover, a variant of the process according to an aspect of the present invention, which also has the steps: d) drying the protective layer by heating the circuit at a drying temperature, and e) curing the protective layer by heating the circuit at a curing temperature, is advantageous. Hereby, the moist compound is essentially completely removed from the layers and the strip conductor. Furthermore, the layers and strip conductor solidify due to a fusion of the individual particles in the layers and strip conductor.

Furthermore, a variant of the process, in which the drying temperature is ≥150° C. and ≤290° C., is advantageous.

Also advantageous is a variant of the process according to the present invention, in which the curing temperature is ≥200° C. and ≤290° C.

Finally, also advantageous is a variant of the process according to the present invention, which is suitable for manufacturing an electric circuit according to the above-mentioned embodiments.

BRIEF DESCRIPTION OF THE DRAWINGS

The present invention is described below based on an exemplary embodiment. In the drawings.

DETAILED DESCRIPTION OF THE PREFERRED EMBODIMENTS

Figure 1:
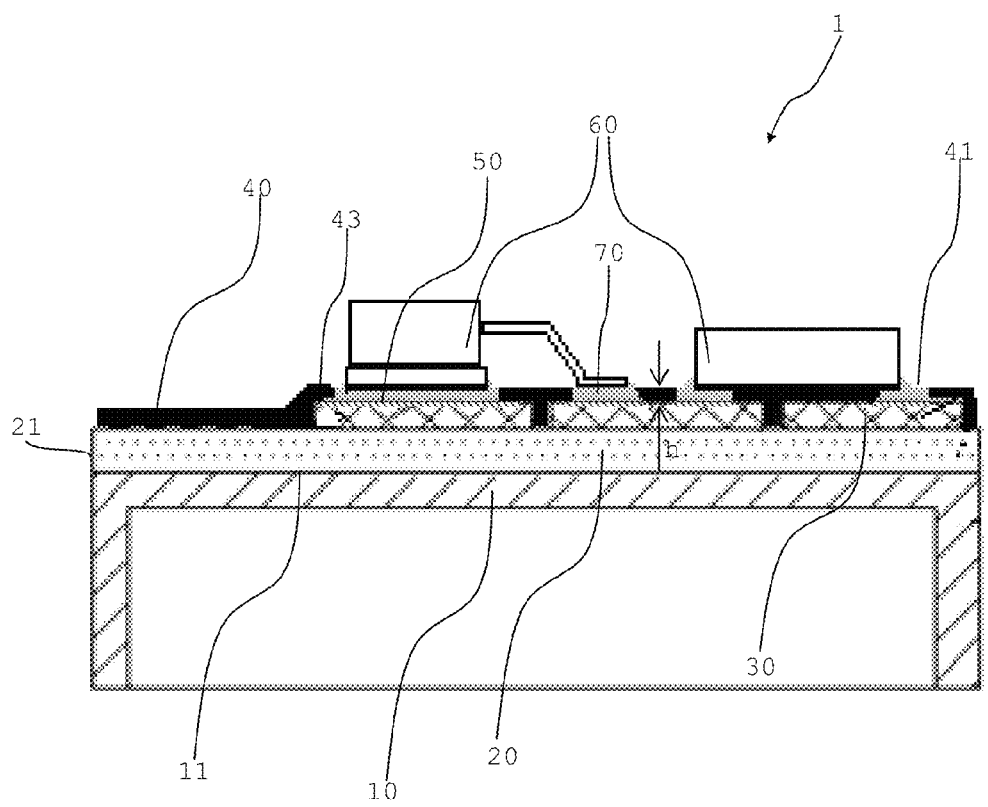
FIG. 1 shows a side sectional view of an electric circuit according to the present invention.

FIG. 1 shows an electric circuit 1 for conducting high current with a carrier body 10, which has a carrier surface 11, an insulation layer 20 covering the carrier surface 11, a strip conductor 30 for conducting current arranged on the insulation layer 20, and with an outer protective layer 40. The protective layer 40 has a plurality of recesses 41 and hereby provides an electric contact area to the strip conductor 30. Furthermore, the circuit 1 has a bonding layer 50, which is arranged between the protective layer 40 and the strip conductor 30.

The carrier body 10 is designed as a pressure housing made of aluminum. It has a cylindrical shape with a flat front surface, which serves as the carrier surface 11. The carrier body 10 additionally has a plurality of fastening flanges (not shown in the Figs.) on the jacket surfaces, by means of which the carrier body 10 can be fastened to an electric motor.

The insulation layer 20 is located directly on the carrier surface 11. The insulation layer 20 consists of aluminum oxide ceramic. It is applied extensively to the carrier surface 11 by means of a spray technology. A sequential application of the insulation layer 20 to the carrier surface 11 would also be conceivable. The material used for insulation layer 20 has a coefficient of thermal conductivity greater than 2 W/K. Further, a layer height or thickness of less than 0.2 mm to 0.1 mm is observed.

In this way, the dissipation of heat via the carrier body 10 can be achieved particularly well. The present invention makes possible a reliable dissipation of heat and thus protects the circuit 1 against overheating especially when using the circuit 1 with high current.

The strip conductor 30 is located on the insulation layer 20, such that there is no contact between the strip conductor 30 and the carrier body 10. The strip conductor 30 consists of an electrically conductive, ductile substance, in the present example aluminum. It is applied by means of a cold gas spray technology using a mask, whereby the masking has a strip conductor layout. The layout is designed here in such a way that it meets the electronic requirements of power electronics. Hereby, strip conductor widths and distances are converted according to the physical calculations. The cross section is calculated from the strip conductor thickness and the strip conductor width. The thickness is preferably approx. 0.25 mm.

The bonding layer 50 is applied locally to the strip conductor 30. In this exemplary embodiment, the bonding layer 50 consists of copper. Electronic components 60 can be soldered to the circuit 1 via the bonding layer 50. However, the bonding layer 50 can be dispensed with, provided that the strip conductor 30 itself can be bonded with solder. The bonding layer 50 is preferably also applied using spray technology, but, in contrast to the above-mentioned strip conductor 30, this layout structure is not absolutely conform, but rather is only used in cases where the functionality of the later bonding to a component by means of soldering is considered to be logical. Thus, it is sufficient to apply a very thin layer height or thickness, which may be considerably smaller than 0.1 mm.

The protective layer 40 is applied by means of a direct printing process, preferably a screen printing process. The material of the protective layer 40 is preferably a polymer selected from the group of silicones, which can be applied especially well to the circuit 1 by means of a screen printing process or template printing process. It is consequently guaranteed that the material covers all open surfaces between the strip conductor sections 30 up to the insulation layer and thus produces a hermetic seal. Not shown in the Figs., but comprised by the present invention is an exemplary embodiment, in which the protective layer 40 covers the lateral edge surfaces 21 of insulation layer 20. Preferably, the protective layer 40 has a coloring. By means of the coloring, an improvement in the radiation of heat via the outer surface of the protective layer can be achieved. To be able to test the circuit 1 for its electric functionality, the protective layer has recesses 41, which provide electric contact areas to the strip conductor 30.

Figure 2:
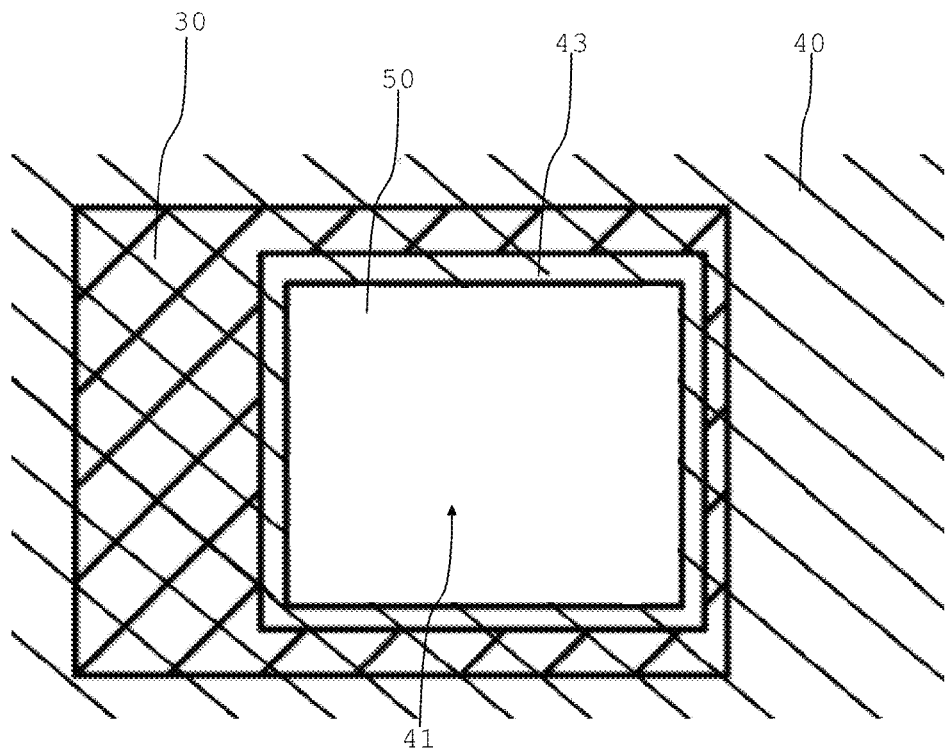
FIG. 2 shows a top view of a cutout of the electric circuit.

The recesses 41 of the protective layer 40 are arranged within partial areas of the strip conductor 30. The shape and size of the recesses essentially correspond to the shape and size of the electronic components 60 and have a basic rectangular shape, as shown in FIG. 2. The size of the recesses 41 is dimensioned here, such that they expose only a part of the bonding layer 50 as a contact area. The strip conductor 30 will thus continue to be completely covered via the protective layer 40 and the bonding layer 50. The protective layer 40 covers the edge areas of the bonding layer 50 and hereby forms an overlapping area 43. As a result, the protective layer 40 guarantees the mechanical solidification of the entire structure. Since the protective layer 40 overlaps or covers the bonding layer 50 all-round, it is achieved that the bonding layer 50 is embedded and thus the adhesive forces of electronic components at the circuit 1 is increased. The above-mentioned statements corresponding to the strip conductor 30 apply to exemplary embodiments, in which a bonding layer 50 is dispensed with.

In the area of the edges of the recess 41, the protective layer 40 has a layer height h for enclosing a flowable compound 70 or bonding material within the recess, which, in the hardened state, fastens the electric components 60 to the circuit 1. In this exemplary embodiment, the recess 40 is filled out by means of a solder 70. The protective layer height h is dimensioned here, such that it, together with the size of the recess 41, encloses a volume, into which sufficient bonding material or solder 70 can be filled. In this example, sufficient is defined as meaning that enough solder 70 can be filled into the recess 41 in order to achieve a stable bond of the electric components 60 to the circuit 1.

The process for manufacturing the circuit 1 proceeds in the following steps. At first, the insulation layer 20 is applied to the carrier surface 11 of the carrier body 10. The strip conductor 30 is then applied to the insulation layer 20. The bonding layer 50 is optionally applied to the strip conductor 30 in a partial area. Then, the protective layer 40 is applied for covering the insulation layer 20, strip conductor 30 and bonding layer 50, whereby the protective layer 40 has the recesses 41, such that the protective layer 40 and the bonding layer 50 form an overlapping area 43 along the edges of the bonding layer 50. As soon as the protective layer 40 has acquired an essentially uniform layer height h, the protective layer 40 is dried by heating the circuit 1 at a drying temperature and is then cured by heating the circuit 1 at a curing temperature. Provided that the electric tests have positive results, the electric components 60 are soldered at the sites of the recesses 41 on the circuit. The drying temperature is ≥150° C. The curing temperature is ≥200° C. 290° C. has proven to be useful as an upper limit for the drying and curing temperature.

The grid-like form pattern or screen template used for applying the protective layer 40 has a plurality of mesh sizes. At the sites where a recess is provided, the screen template is designed as impermeable to materials.

A high-speed gas spray process is preferably used for applying the insulation layer 20. For the strip conductor as well as the bonding layer, a cold gas spray process is preferred.

The invention claimed is:

1. A method for manufacturing an electric circuit, the electric circuit having: a carrier body, which has a carrier surface, an insulation layer covering the carrier surface, a strip conductor for conducting current arranged on the insulation layer, and an outer protective layer, the method comprising:
 a) applying the insulation layer onto the carrier surface using a high-speed gas spray process, the insulation layer consisting of aluminum oxide ceramic,
 b1) applying the strip conductor onto the insulation layer,
 b2) applying a bonding layer in a partial area of the strip conductor,
 c) applying the protective layer by a screen printing process for covering the insulation layer, the strip conductor, and the bonding layer, whereby the protective layer has at least one recess to provide an electric contact area to the strip conductor, such that the protective layer and the bonding layer form an overlapping area along the edges of the bonding layer, and
 d) filling the at least one recess with a solder material.

2. The method in accordance with claim 1, wherein the at least one recess is arranged within a partial area of the strip conductor.

3. The method in accordance with claim 1, wherein the protective layer contains a material selected from the group of polymers.

4. The method in accordance with claim 1, the protective layer contains a material selected from the group of silicones.

* * * * *